(12) United States Patent
Cadoux et al.

(10) Patent No.: US 8,378,663 B2
(45) Date of Patent: *Feb. 19, 2013

(54) CURRENT MEASUREMENT SIGNAL DEVICE WITH ELECTRICAL ISOLATION, ELECTRONIC TRIP UNIT, AND CIRCUIT BREAKER COMPRISING ONE SUCH DEVICE

(75) Inventors: Yvan Cadoux, Saint Aupre (FR); Didier Leonard, Seyssinet (FR); Bruno Reymond, Moirans (FR)

(73) Assignee: Schneider Electric Insustries SAS, Rueil Malmaison (FR)

( * ) Notice: Subject to any disclaimer, the term of this patent is extended or adjusted under 35 U.S.C. 154(b) by 0 days.

This patent is subject to a terminal disclaimer.

(21) Appl. No.: 12/312,904

(22) PCT Filed: Dec. 10, 2007

(86) PCT No.: PCT/FR2007/002025
§ 371 (c)(1),
(2), (4) Date: Jun. 2, 2009

(87) PCT Pub. No.: WO2008/087275
PCT Pub. Date: Jul. 24, 2008

(65) Prior Publication Data
US 2010/0045263 A1    Feb. 25, 2010

(30) Foreign Application Priority Data
Dec. 18, 2006 (FR) .................................... 06 11008

(51) Int. Cl.
*G01R 15/18* (2006.01)

(52) U.S. Cl. .................................... 324/127; 324/117 R
(58) Field of Classification Search .................. None
See application file for complete search history.

(56) References Cited

U.S. PATENT DOCUMENTS

| 4,042,871 A | * | 8/1977 | Grubbs et al. | .................. 363/28 |
| 5,195,012 A | | 3/1993 | Tripodi | |
| 5,726,846 A | | 3/1998 | Houbre | |

(Continued)

FOREIGN PATENT DOCUMENTS

| EP | 1 326 339 A2 | 7/2003 |
| GB | 1585889 | 3/1981 |

(Continued)

OTHER PUBLICATIONS

Tang, S.C., "Coreless PCB transformers with Multiple Secondary Windings for Complementary Gate Drive Circuits," IEEE, vol. 2, May 17, 1998, pp. 1965-1971.

*Primary Examiner* — Vinh Nguyen
(74) *Attorney, Agent, or Firm* — Steptoe & Johnson LLP

(57) ABSTRACT

The current measurement device with electrical isolation comprises an input signal connected to an electrical shunt, an output of an output signal, and signal transfer means with electrical isolation receiving the input signal and supplying said output signal. The transfer means comprise at least one signal transformer having at least one primary winding to receive a primary signal representative of said input signal, switching means to switch the input signal and supply the latter to said primary winding, and electrically isolated control means of the switching means comprising a control input receiving control signals during switching periods. A trip unit and an electrical circuit breaker comprises one such current measurement device and a processing unit processing electrical protection functions.

30 Claims, 8 Drawing Sheets

U.S. PATENT DOCUMENTS

| | | | |
|---|---|---|---|
| 5,793,196 A * | 8/1998 | White | 324/127 |
| 6,069,780 A | 5/2000 | Del Vecchio et al. | |
| 6,137,665 A | 10/2000 | Boudaud | |
| 6,191,589 B1 * | 2/2001 | Clunn | 324/424 |
| 6,707,287 B2 * | 3/2004 | Takeda et al. | 324/127 |
| 7,619,866 B2 | 11/2009 | Houbre et al. | |
| 7,834,613 B2 * | 11/2010 | Ziegler et al. | 324/127 |
| 2003/0076086 A1 | 4/2003 | Takeda et al. | 324/127 |
| 2010/0060261 A1 * | 3/2010 | Cadoux et al. | 324/127 |

FOREIGN PATENT DOCUMENTS

| | | |
|---|---|---|
| GB | 1585890 | 3/1981 |
| JP | 03 077070 | 4/1991 |
| JP | 07 110347 | 4/1995 |

\* cited by examiner

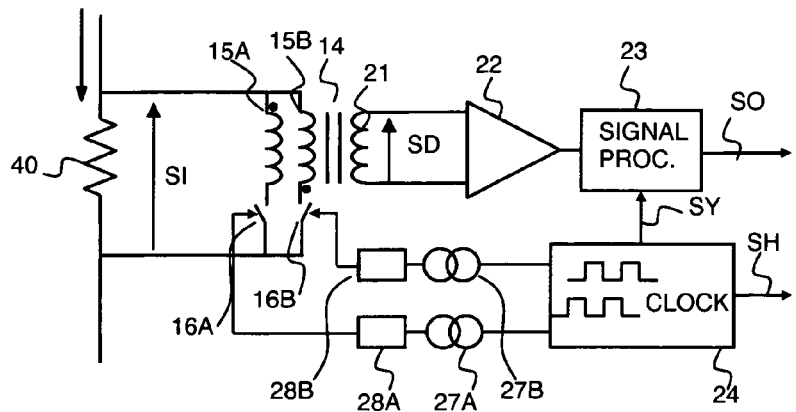
FIG. 4
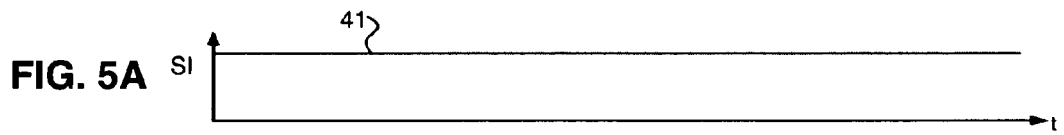
FIG. 5A SI
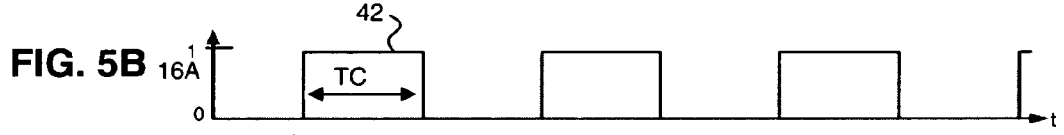
FIG. 5B 16A
FIG. 5C 16B
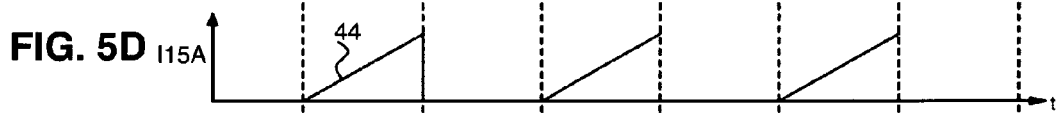
FIG. 5D I15A
FIG. 5E I15B
FIG. 5F I15
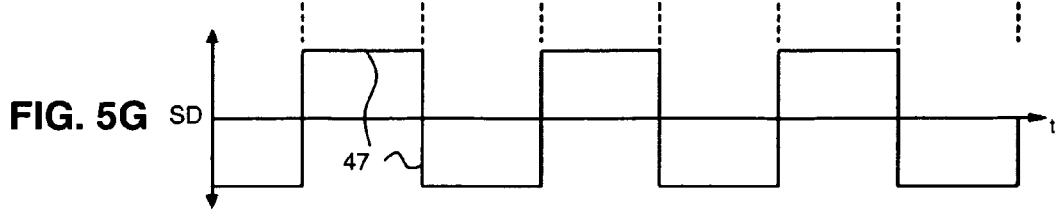
FIG. 5G SD

CURRENT MEASUREMENT SIGNAL DEVICE WITH ELECTRICAL ISOLATION, ELECTRONIC TRIP UNIT, AND CIRCUIT BREAKER COMPRISING ONE SUCH DEVICE

This application is a national stage entry of International Application No. PCT/FR2007/002025, filed Dec. 10, 2007 designating the U.S., which claims the benefit of French Application No. 06 11008, filed Dec. 18, 2006.

BACKGROUND OF THE INVENTION

The invention relates to a current measurement device with electrical isolation comprising:
at least one electrical shunt designed to have a current to be measured flow through the latter,
at least one input signal input connected to said shunt to receive a signal representative of a current,
an output of an output signal representative of said input signal representative of a current, and
signal transfer means with electrical isolation receiving the input signal and supplying said output signal,
said transfer means comprising:
at least one signal transformer having at least one primary winding to receive a primary signal representative of said input signal,
switching means to switch the input signal and provide said primary signal representative of said input signal to said primary winding, and
control means of the switching means comprising a control signal input receiving control signals during switching periods, and an output electrically isolated from the control signal input and connected to said switching means to command primary signal switching during said switching periods.

The invention also relates to an electronic trip unit and a circuit breaker comprising one such current measurement device.

STATE OF THE ART

Known current measurement devices with electrical isolation are generally achieved with current transformers. But when the current to be measured is either AC or DC, coupling devices connected to shunts can be used. Such known coupling devices with electrical isolation are generally achieved with a first part 1 for processing an input signal SI and a second part 2 for processing an output signal SO. A diagram of a known device is represented in FIG. 1. A first input signal part 1 generally comprises a signal amplifier 3 and a modulator 4 to transfer a transformed value or a digital value of the input signal. The modulator 4 is generally connected to a transformer 5 or to other couplers to isolate the first part 1 from the second signal processing part 2. In the second part 2, the signal is processed and reconditioned in a circuit 6 to be processed as output signal SO. In devices of the prior art, the first part 1 receiving the input signal requires an electric power supply circuit 7 for the amplifier and modulator to be able to work. In the prior-art layout, a first main electric power supply 8 supplies the output signal processing circuit 6 and an electric power conversion circuit comprising a chopper 9 and a power supply transformer 10 and the circuit 7 to supply electric power to the whole of first part 1.

In other layouts there can be two independent power supplies to supply the first part and the second part separately.

Known state-of-the-art measurement current measurement devices with electrical isolation requiring auxiliary power supply circuits are difficult to integrate in measurement processing circuits or equipment units of small dimensions. Moreover, such devices also have the drawback of consuming electric power thereby making them incompatible with very low-consumption applications. In particular, they cannot be easily integrated in modular electrical circuit breakers.

Certain devices comprise transformers receiving a switched current measurement signal as represented in the documents GB1585889 and US2003/0076086. However, in the document US2003/0076086 the signal switch control means are opto-electronic components that are incompatible with industrial applications having large thermal stresses. In particular, these components have efficiency and speed characteristics that decrease very greatly when the temperature increases. These high operating temperatures are particularly present in electrical equipment such as electronic trip devices and electrical circuit breakers.

SUMMARY OF THE INVENTION

The object of the invention is to provide a current measurement device with electrical isolation that does not require power supply of the part processing the input signal and that is able to operate normally with very large temperature swings, as well an electronic trip unit and a circuit breaker comprising one such device.

In a current measurement device with electrical isolation according to the invention, said control means of the switching means comprise coupling means by electromagnetic induction and/or by capacitive connection.

Said signal transformer comprises an output winding connected to detection means receiving a switched secondary output signal and supplying an output signal representative of the input signal.

In a first alternative embodiment, input signal switching is unidirectional. In a second alternative embodiment, input signal switching is bidirectional or with reversal.

In a first particular embodiment, the signal transformer comprises two primary windings connected with opposite winding directions, a first end of each winding is connected to a common point of the windings to receive the signal input, and second ends of the windings are connected to first switching means and to second switching means connected to a second end of said shunt to switch and direct the input signal alternately onto the first and second winding.

The switching means preferably switch input signals onto the primary windings with command overlap at the start and end of switching.

In a second particular embodiment, the signal transformer comprises a primary winding connected to switching means comprising four electronic switches connected in the form of a bridge with two branches, external lines of the bridge connected to said shunt to receive the input signal and internal branches of the bridge being connected to said primary winding of said signal transformer, said switches in the form of a bridge being commanded alternately in crossover manner to reverse the direction of the primary signal applied to the primary winding of said signal transformer.

In a third particular embodiment, the input signal is applied to a shunt formed by a bridge of two measuring resistors connected in series, a common point of the measuring resistors being connected to a first end of a primary winding of the signal transformer, a second end of said primary winding of the signal transformer being connected to a common central part of a switching bridge with two switches of the switching means, external lines of the switches of said bridge being connected to the external parts opposite the common point of the resistor bridge, the two switches operating alternately to reverse the direction of the primary signal applied to the primary winding of said signal transformer.

The detection means preferably comprise means for filtering the switched output signal.

In a preferred embodiment, the detection means comprise synchronous detection means synchronized with control of the switching means to reconstitute an output signal representative of said input signal.

Advantageously, the signal transformer comprises:
at least a first primary winding to receive a first input signal representative of a current flowing in a first shunt and at least first switching means to switch said first input signal,
at least a second primary winding to receive a second input signal representative of a current flowing in a second shunt and at least second switching means to switch said second input signal, sais second shunt being electrically separated from said first shunt, and
at least one secondary winding to supply a signal representative of said first input signal or of said second input signal.

Advantageously, the current measurement device comprises processing means:
to select first control means of said first switching means to supply an output signal representative of said first input signal, or
to select second control means of said second switching means to supply an output signal representative of said second input signal.

Preferably, the processing means command selection of the control means sequentially to supply a multiplexed output signal sequentially representative of each input signal.

Advantageously, the processing means command control means simultaneously to supply an output signal representative of the sum of the input signals.

Preferably, the processing means comprise signal sampling means to sample an output signal representative of a multiplexed secondary signal and to supply values representative of each input signal, sampling being synchronized with selection of the control means.

Preferably, sampling is performed after a preset time delay following the start of a control impulse closing the switching means.

Preferably, the processing means activate command of the control means during periods of short duration and stop command of the control means during periods of long duration.

In a preferred embodiment, said control means of the switching means comprise at least one control transformer having a primary winding receiving the control signals and a secondary winding to control switching means.

Preferably, at least one control transformer of the control means is an air-insulated transformer having a primary winding on a first face of a circuit support and a secondary winding on a second face of said circuit support.

Preferably, the circuit support is composed of a polyimide material. Advantageously, the circuit support has a thickness comprised between 3 and 80 μm.

In another embodiment, the measuring transformer is an air-insulated transformer having at least one primary winding on a first face of a circuit support and a secondary winding on a second face of said circuit support.

Advantageously, the circuit support is composed of a polyimide material and has a thickness comprised between 3 and 80 μm.

In another embodiment, said at least one control transformer and at least one measuring transformer are placed on the same insulating support with windings on each side of said circuit support.

Advantageously, the circuit support is composed of a polyimide material and has a thickness comprised between 3 and 80 μm.

In another embodiment, said control means of the switching means comprise at least two capacitive coupling capacitors each having a first electrode to receive the control signals and a second electrode to command switching means.

Advantageously, a circuit support being composed of a polyimide material and having a thickness comprised between 3 and 80 μm, said circuit support has the first electrodes of said two coupling capacitors on a first face and the second electrodes of said two coupling capacitors on the second face.

In another embodiment, the measuring device comprises control means of the switching means and the switching means are grouped in an electromagnetic microcomponent of MEMS type.

An electronic trip unit according to the invention comprising:
a current measurement device,
a processing unit for processing protection functions connected to the current measurement device to receive at least one signal representative of a current,
a trip output to supply a trip signal according to said at least one current signal, comprises at least the current measurement device defined above comprising at least one electrical shunt for flow of a current to be measured, the current signal supplied to the processing unit being processed by the protection functions to supply a trip signal.

An electrical circuit breaker according to the invention comprising:
electric power contacts,
an operating mechanism commanding opening of said electric contacts,
a current measurement device connected in series with said electric contacts,
a processing unit for processing protection functions connected to the current measurement device to receive at least one signal representative of a current,
a trip output to supply a trip signal of opening of the electric contacts according to said at least one current signal,
comprises at least the current measurement device defined above comprising:—at least one electrical shunt for flow of a current to be measured, the current signal supplied to the processing unit being processed by the protection functions to supply said trip signal of opening of the electric contacts.

BRIEF DESCRIPTION OF THE DRAWINGS

Other advantages and features will become more clearly apparent from the following description of particular embodiments of the invention, given as non-restrictive examples only and represented in the accompanying drawings in which:

FIG. 4 represents a first diagram of a current measurement device according to an embodiment of the invention of switching with reversal type;

FIGS. 5A to 5G represent timing charts of signals in a device according to the embodiment of FIG. 4;

DETAILED DESCRIPTION OF PREFERRED EMBODIMENTS

Figure 1:
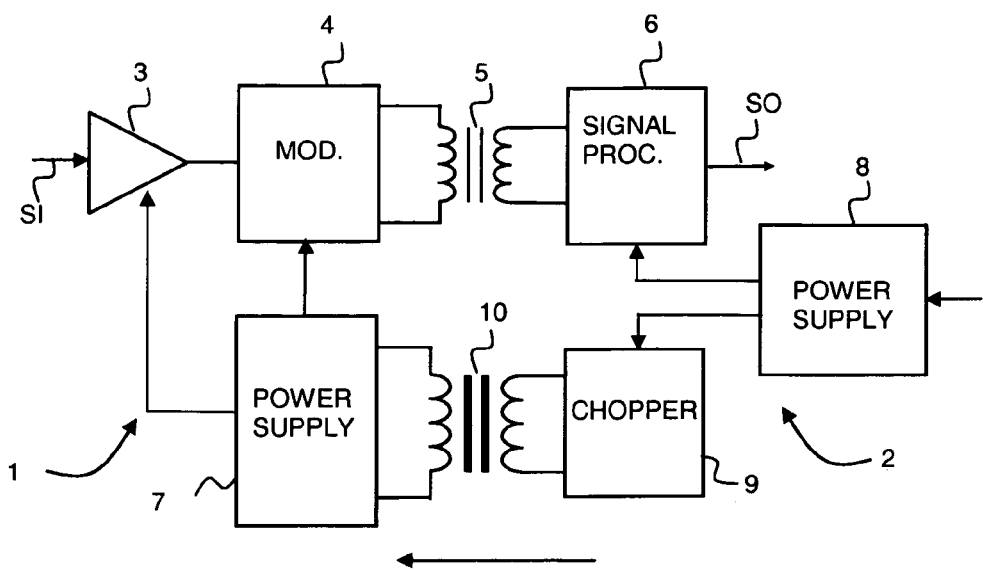
FIG. 1 represents a diagram of a current measurement device with electrical isolation according to the state of the art.
Figure 2:
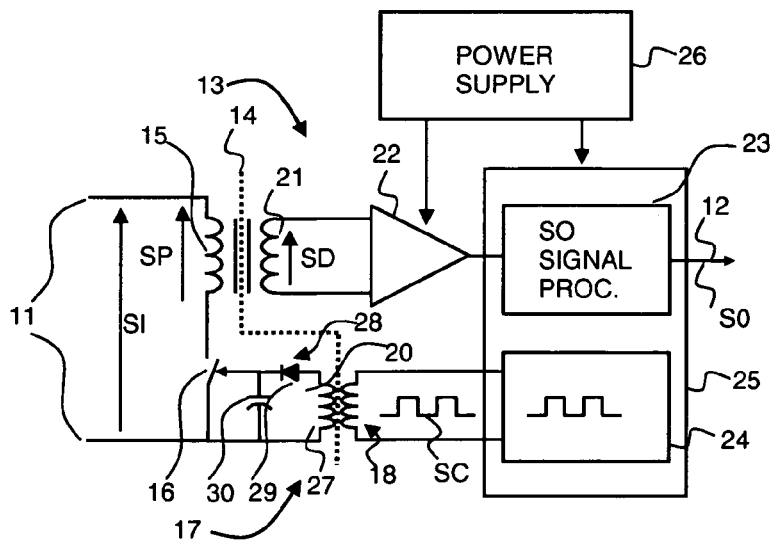
FIG. 2 represents a diagram of a current measurement device according to a first embodiment of the invention.

FIG. 2 represents a diagram of a current measurement device according to a first embodiment of the invention. The current measurement device with electrical isolation comprises at least one input 11 of an input signal SI connected to an electrical shunt 40 for measuring a current IP. The device also comprises an output 12 of an output signal SO representative of said input signal, and signal transfer means 13 with electrical isolation receiving the input signal and supplying said output signal. The transfer means comprise at least one signal transformer 14 having at least one primary winding 15 to receive a primary signal SP representative of said input signal SI. The input signal is switched by switching means 16 represented by a controlled switch to supply said primary signal SP representative of said input signal SI to said primary winding 15. Switching means 16 are commanded by control means 17 comprising a control signal input 18 receiving control signals SC. An output 20 of the control means is electrically isolated from control signal input 18 and is connected to said switching means 16 to command primary signal switching at a switching frequency.

In FIG. 2 the signal SI is switched by electronic switch 16 at a high switching frequency to supply a switched signal SP on primary winding 15 of signal transformer 14. Said signal transformer 14 comprises an output winding 21 connected to detection means 23 receiving a switched secondary output signal SD and supplying an output signal SO representative of input signal SI. The secondary signal SD induced in a secondary winding 21 of the signal transformer is then processed to supply output signal SO. Processing can comprise amplification in an amplifier 22 followed by detection and filtering in an output signal processing module 23. Detection can be performed by single-alternation rectifying, by envelope detection or by synchronous rectifying.

Control signal SC of the switching means is preferably provided by a switching signal generator 24 located in second signal processing part 2. Processing module 23 and control signal generator 24 are preferably located in the same processing unit 25 and are supplied by the same power supply circuit 26. This power supply circuit 26 can also supply amplifier 22. The control signals are applied to an impulse transformer 27 of the isolated control means. The output of the control means can comprise a signal conditioning circuit 28 comprising for example a diode 29 and a capacitor 30 to be adapted to switching means 16.

Figure 3:
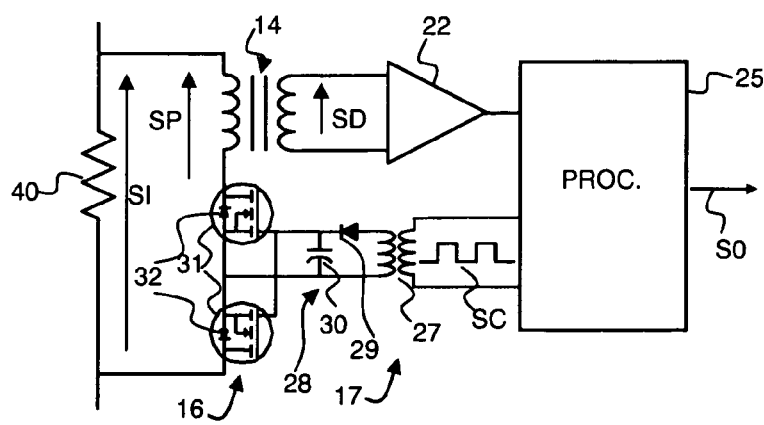
FIG. 3 represents a diagram of a device according to FIG. 2 with switching control by transistors.

FIG. 3 shows a layout diagram of a device according to an embodiment of the invention with switching control with field-effect transistors 31 having reverse-connected internal diodes 32. These transistors are connected in series in reverse direction, i.e. their sources are connected together and act as reference for the control signals supplied by impulse transformer 27, and their control electrodes are connected together to receive said control signals of the transformer 27 via conditioner 28. Whatever the direction or the polarity of the input signal, the two transistors are turned on. If no control signal is supplied, both the transistors are turned off, and depending on the direction or the polarity of the input signal, only one of the two diodes blocks the input signal. With such a layout, the device operates whatever the polarity and the level of the input signal which can be AC or DC. In the diagram of FIG. 3, a measuring or load resistor 40 is connected on input of the device to generate input signal SI. If resistor 40 is an electrical shunt, signal SI is a current measurement signal.

If the input signal has a very low voltage, less than 0.6 volts for example, a single field-effect transistor 31 can be sufficient. In this zone, the transistor operates bidirectionally and the associated diode is not turned-on in forward bias.

For current measurement, the input impedance of signal transformer 14 is preferably very low. Primary winding 15 then comprises a small number of turns.

The current measurement device can operate in switching mode of the unidirectional input signal by switching the input signal in the same polarity on consecutive control orders and applying it also with the same polarity to the primary winding of the signal transformer.

To improve operation of signal transformer 14, switching of the input signal can advantageously be bidirectional. In this case, the input signal is switched and reversed at each command order to supply a primary signal having reverse consecutive induction directions on a primary induction circuit of signal transformer 14. Thus, a magnetic coupling circuit of the signal transformer is magnetized in one direction and then demagnetized and re-magnetized in another direction according to the control orders to control the remanence of said magnetic circuit and improve the efficiency of signal transfer between the primary and secondary of transformer 14.

FIG. 4 represents a first diagram of a current measurement device according to an embodiment of the invention with bidirectional switching. In this case, signal transformer 14 comprises two primary windings 15A and 15B connected with reverse winding directions, a first end of each winding is connected to a common point of the windings to receive the input signal input, second winding ends are connected to first switching means 16A and to second switching means 16B to switch and direct input signal SI alternately onto the first and second winding. Preferably, to improve operation of the magnetic circuit of transformer 14, the switching means switch the signals onto the primary windings with a command overlap at the start and end of switching. Signal generator 24 supplies the control signals of switching means 16A and 16B represented by controlled switches. Generator 24 also supplies a first synchronization signal SY to processing module 23 to perform synchronous detection of the output signal. Depending on the direction of the signal on the primary, the output signal can in fact be positive or negative. Synchronous detection enables a signal polarity representative of the input signal polarity to be had. Generator 24 can also supply or receive a second synchronization signal to operate with a signal sampler. The generator, synchronous detector, and sampler can form part of the same circuit.

FIGS. 5A to 5G represent timing charts of signals in a current measurement device according to the embodiment of FIG. 4. In FIG. 5A, a plot 41 shows an input signal SI. In this figure, input signal SI is DC and of positive polarity. FIG. 5B shows a plot 42 representative of control of switching means switch 16A. FIG. 5C shows a plot 43 representative of control of switching means switch 16B. FIG. 5D shows a plot 44 representative of a current I15A in first primary winding 15A of signal transformer 14. FIG. 5E shows a plot 45 representative of a current I15B in second primary winding 15B of signal transformer 14. FIG. 5F shows a plot 46 representative of a current resultant I15 corresponding to currents I15A and I15B flowing in the two primary windings 15A and 15B of signal transformer 14 controlled with direction reversal. FIG. 5G shows a plot 47 representative of an output signal SD on secondary winding 21 of signal transformer 14.

At a time t1, closing of switch 16A is commanded whereas switch 16B has just opened. Winding 15A receives input signal SI. It generates a current I15A and an increasing magnetic induction I15. This induction generates an output signal on the transformer secondary 21 that is equal to the derivative of the flux, therefore a positive signal SD. At a time t2, closing of switch 16B is commanded whereas opening of switch 16A is commanded. A current I15B flows in winding 15B. Current I15A is cancelled out. The resulting magnetic induction represented by I15 decreases because winding 15B is coiled in the opposite direction from winding 15A. Signal SD on the transformer secondary becomes negative. The alternating switchings of switches 16A and 16B induce a magnetic induction without any discontinuity in transformer 14 and thereby generate an AC signal SD with a zero DC component.

With such a device, the induction currents in the primary are never interrupted and the disturbances due to switchings in the primary windings are not induced in the secondary output signal SD. The output signal SD can be rectified to supply a signal of the same sign as the primary signal. A switching period TC can be defined between the start of turn-on and end of turn-on of a switch 16, for example between times t1 and t2.

Figure 6:
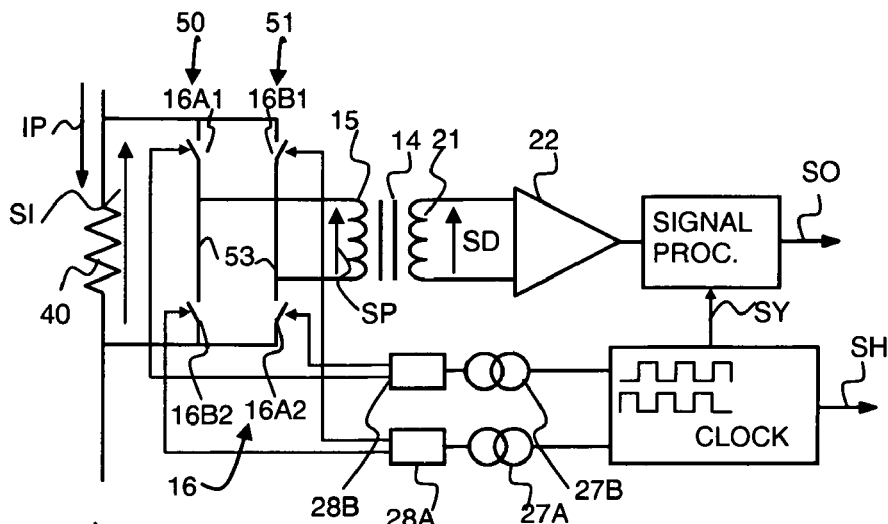
FIGS. 6 and 7 represent alternative embodiments of current measurement devices according to embodiments of the invention of switching with reversal type.

FIG. 6 represents a second diagram of a current measurement device according to an embodiment of the invention with bidirectional switching. In this case, signal transformer 14 comprises a primary winding 15 connected to switching means 16 comprising four electronic switches 16A1, 16A2 and 16B1, 16B2 connected in the form of a bridge with two branches 50 and 51. In this layout, external lines of the bridge receive input signal SI and internal parts 53 of the branches of the bridge are connected to said primary winding 15 of signal transformer 14. Said switches 16A1, 16A2 and 16B1, 16B2 in the form of a bridge are commanded alternately in crossover manner to reverse the direction of primary signal SP applied to primary winding 15 of said signal transformer 14. Cross-connected switches 16A1 and 16A2 are commanded at the same time to apply the input signal in a first direction and cross-connected switches 16B1 and 16B2 are commanded at the same time to apply the input signal in a second direction. Resistor 40 can be a measuring resistor or an electrical shunt for measuring current signals.

Figure 7:
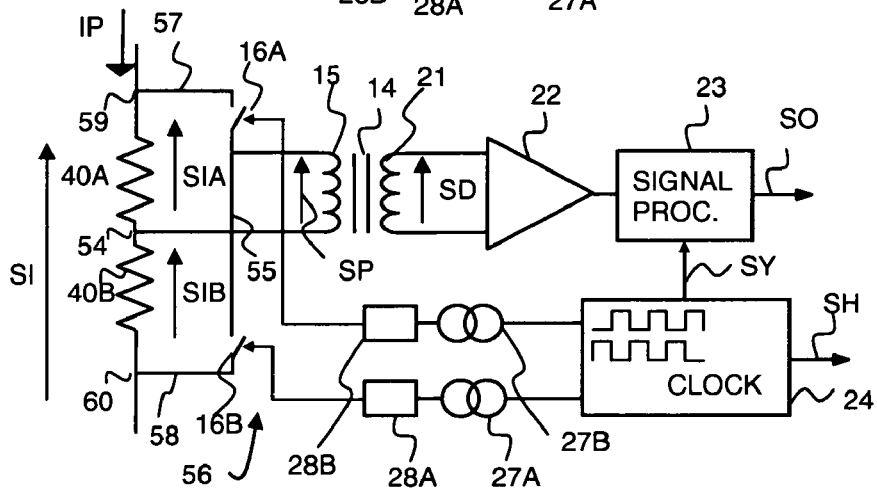

FIG. 7 represents a third diagram of a current measurement device according to an embodiment of the invention with bidirectional switching. In this case, input signal SI is applied to a bridge of two measuring resistors 40A and 40B connected in series. A common point 54 of the measuring resistors is connected to a first end of a primary winding 15 of signal transformer 14, and a second end of said primary winding of the transformer signal is connected to a common central part 55 of a switching bridge 56 with two switches 16A and 16B of the switching means. External lines 57 and 58 of the switches of said bridge are connected on external parts 59 and 60 opposite common point 54 of the resistor bridge. The two switches 16A and 16B operate alternately to reverse the direction of primary signal SP applied to primary winding 15 of said signal transformer 14. When switch 16A is closed and switch 16B is open, a part SIA of signal SI flowing in resistor 40A and having a first sign, for example positive, is applied to winding 15. Then, on a subsequent switching command, switch 16B is closed and switch 16A is open. In this case, a part SIB of signal SI present on measuring resistor 40B and having a second negative sign opposite to the first sign is applied to transformer primary winding 15. The signal on resistor 40B is of opposite polarity to the signal on resistor 40A as the signal reference is on common point 54.

Figure 8A:
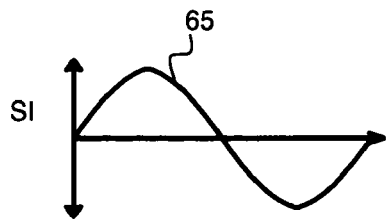
FIGS. 8A to 8C represent plots of signals in current measurement devices according to embodiments of the invention with bidirectional switching.
Figure 8B:
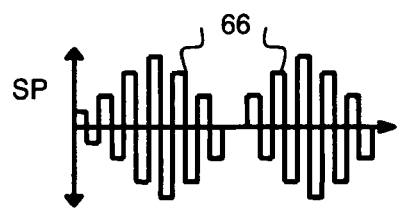
Figure 8C:
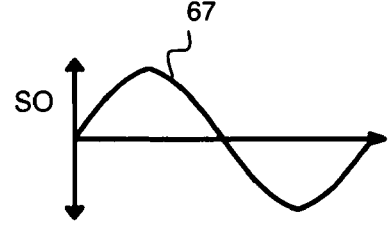

FIGS. 8A to 8C represent plots of signals in current measurement devices according to embodiments of the invention with bidirectional switching. In FIG. 8A, a plot 65 shows an AC input signal SI of sine wave form. In FIG. 8B, a plot 66 shows a signal SD supplied on a secondary of a signal transformer having bidirectional primary signal SP control. In FIG. 8C, a plot 67 shows an output signal SO processed so as to reconstitute a sine-wave signal representative of the input signal. The processing means detect the bidirectional signal by rectifying the signal in synchronized manner, for example with bridges of electronic switches or electronic circuits with programmed sampling and processing. The detection means thus comprise means for filtering the switched output signal and/or synchronous detection means synchronized with control of the switching means to reconstitute an output signal representative of said input signal.

To limit the electrical consumption of the device, processing means 25 can activate command of the control means during periods of short duration and stop command of the control means during longer periods of inactivity. For example, in the diagram of FIG. 6, cross-connected switches 16A1 and 16A2 are commanded during a first period, then during a second period, switches 16B1 and 16B2 are commanded whereas switches 16A1 and 16A2 are shut down. Finally, for all the switches, control is stopped during a third period. Preferably, the first and second periods are shorter than the third period. The periods can be regular in a preset cycle or duty cycle or be commanded randomly according to the requirements of the processing means.

Figure 9:
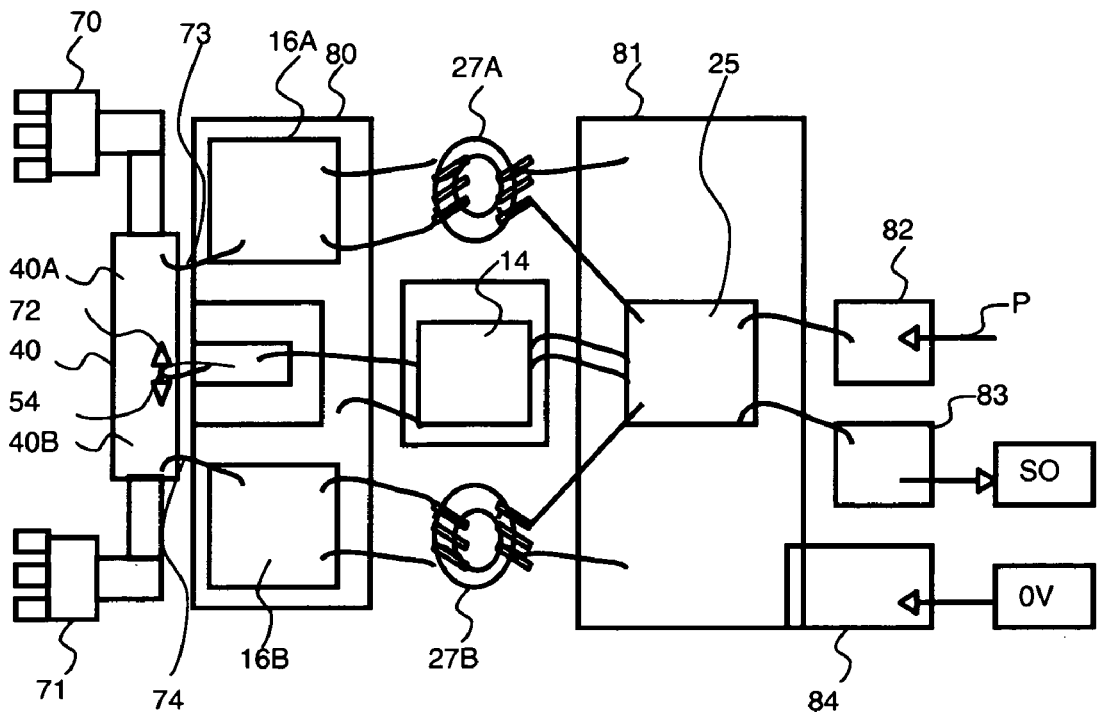
FIG. 9 represents an embodiment of a current measurement device according to an embodiment of the invention of the diagram of FIG. 7.

FIG. 9 represents an embodiment of a current measurement device according to an embodiment of the invention of the diagram of FIG. 7. In this embodiment, measuring resistor 40 is an electrical shunt for measuring the electric current. Output signal SO is then representative of an electric current flowing in said shunt. The shunt comprises a mid-point 54 separating a first part 40A and a second part 40B on each side of the mid-point. The shunt comprises power connection pads for the measurement to flow and three measurement connections. A common connection 72 is connected to point 54 of the shunt, a first external connection 73 is connected to the same side as first part 40A and a second external connection 74 is connected to the same side as second part 40B. The switching means such as electronic switches 16A and 16B and other annexed components such as conditioning circuits 28 are arranged on a first printed circuit 80 at the electrical potential of a circuit to be measured. This circuit 80 receives the connections with the shunt and connections with the primary of signal transformer 14 and connections with impulse transformers 27A and 27B of control means 17. A second printed circuit 81 supports circuits of processing unit 25 such as detection and processing circuits 23 and control signal generators 24. The electronic circuits on printed circuit 81 are at a different potential and are electrically and galvanically switched with respect to the electronic circuits located on printed circuit 80. Printed circuit 81 has connections on one side with signal transformer 14 and impulse transformers 27A and 27B and connections on another side with an input P of power supply 82, an output 83 of signal SO and a common ground 0V input 84.

For measuring several voltage or current signals, several devices as described above can be used in parallel. However, in particular embodiments of the invention, the signal transformer forms part of a multiplexing unit.

Figure 10:
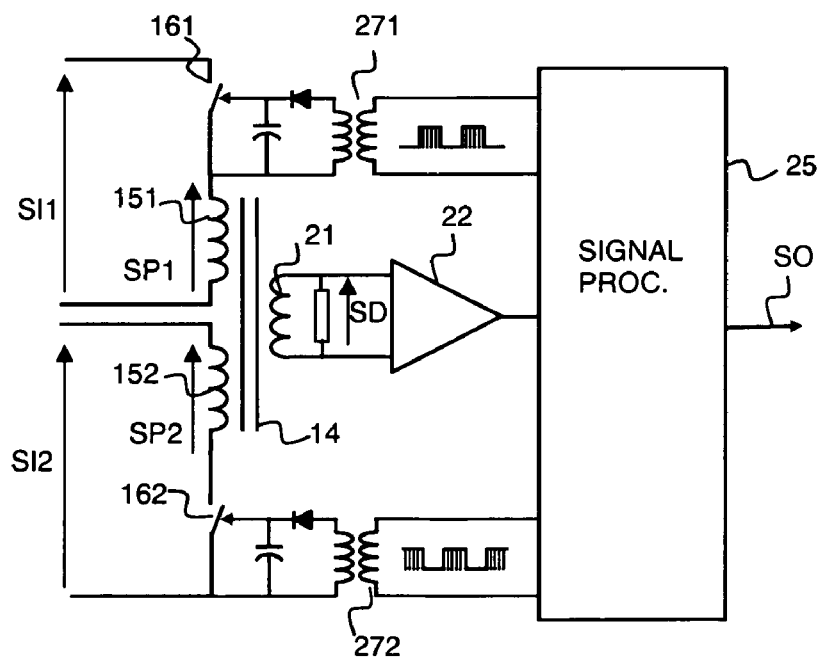
FIG. 10 represents a first diagram of a current measurement device according to an embodiment of the invention with input signal multiplexing on a common signal transformer.

FIG. 10 represents a first diagram of a current measurement device according to an embodiment of the invention with input signal multiplexing on a common signal transformer 14. Signal transformer 14 comprises: at least a first primary winding 151 to receive a first input signal SI1 and at least first switching means 161 to switch said first input signal SI1, and at least a second primary winding 152 to receive a second input signal SI2 and at least second switching means 162 to switch said second input signal SI2, and at least one secondary winding 21 to supply a secondary signal SD representative of said first input signal SI1 or of said second input signal SI2.

A processing unit 25 selects first control means 271 of said first switching means 161 to supply an output signal SO representative of said first input signal SI1, or selects second control means 272 of second switching means 162 to supply an output signal SO representative of said second input signal SI2. Thus, on signal SD of secondary winding 21 of the signal transformer, there can be either a signal representative of the first input signal or a signal representative of the second input signal, or a signal representative of a combination of the input signals according to control of the switches of the switching means.

Figure 11:
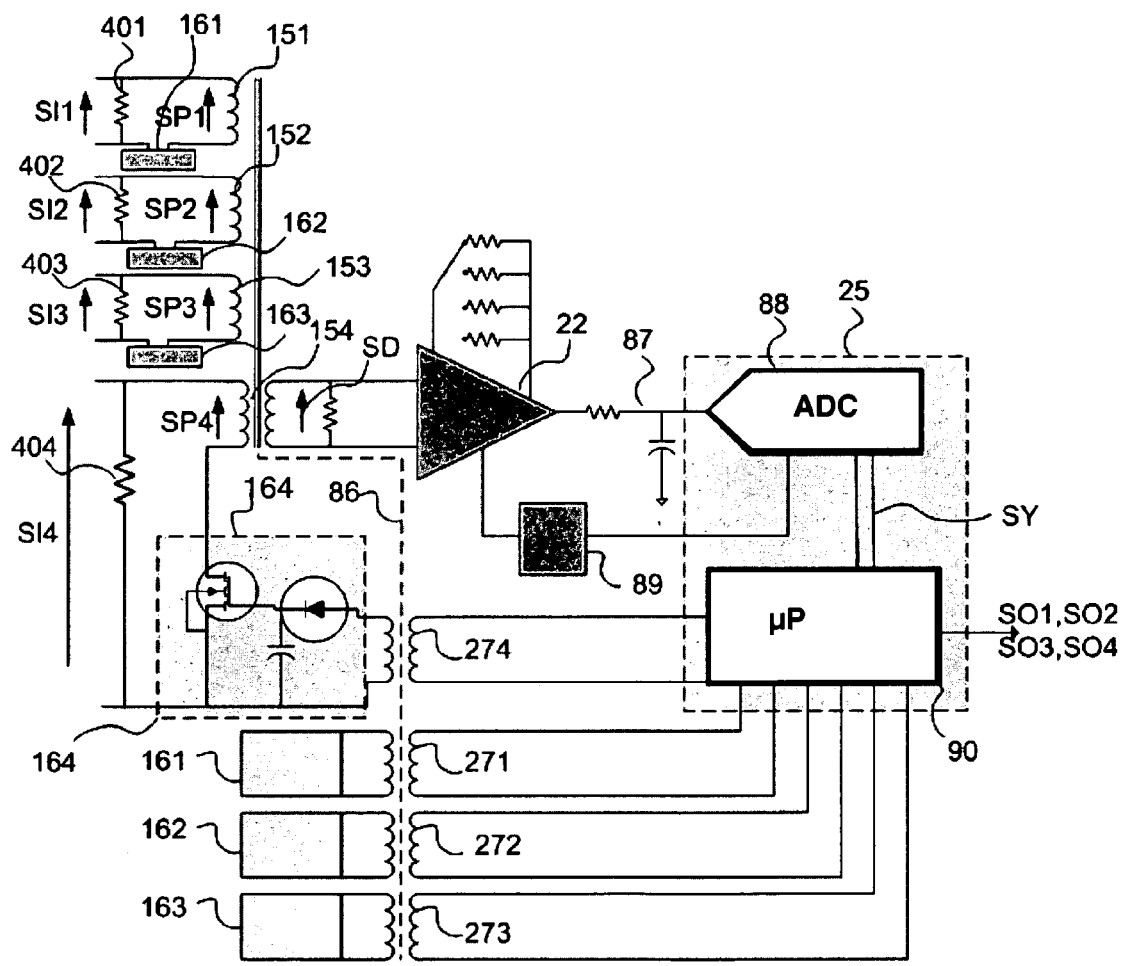
FIG. 11 represents a second diagram of a current measurement device according to an embodiment of the invention with input signal multiplexing on a common signal transformer.

FIG. 11 represents a second diagram of a current measurement device according to an embodiment of the invention with multiplexing of input signals SI1, SI2, SI3, SI4 on a common signal transformer 14. The four signals SI1 to SI4 can be generated on measuring resistors 401, 402, 403 or 404 and then switched by switching means respectively 161, 162, 163, and 164 and controlled by impulse transformers of the control means respectively 271, 272, 273 and 274. In the diagram, switching means 274 are completely represented in one part only whereas the others are represented by blocks in two parts to alleviate the diagram. Switching of the input signals enables primary signals SP1, SP2, SP3 and SP4 to be supplied to primary windings 151, 152, 153 and 154 of signal transformer 14. Galvanic or electrical isolation is represented by a broken line 86. Secondary signal SD is applied to an amplifier 22 having adjustable amplification parameters. The output signal from the amplifier is filtered by a low-pass filter 87 before being applied to processing unit 25. Processing unit 25 comprises a signal sampler 88 to sample a signal representative of a multiplexed secondary signal and to supply values representative of each input signal, sampling being synchronized with selection of the control means. Amplifier 22 and sampler 88 are referenced by a reference circuit 89. A microcontroller or a microprocessor located in the processing unit enables control signals of the switching means to be supplied and performs synchronization of the sampling for synchronous detection purposes. Microprocessor 90 receiving the samples of signal SD separates the different values into several output signals SO1, SO2, SO3 and SO4 each respectively representative of input signals SI1, SI2, SI3 and SI4.

The processing means preferably command selection of the control means sequentially to supply a multiplexed output signal SO sequentially representative of each input signal SI1 to SI4. Advantageously, the processing means can command control means simultaneously to supply an output signal SO representative of the sum of the input signals.

With a layout such as the one in the diagram of FIG. 11, the current measurement device can be an electronic trip unit used in a four-pole circuit breaker receiving signals representative of signals from three phases and a neutral conductor. Measuring resistors 401, 402, 403 or 404 are then current measurement shunts. In case of earth protection, simultaneous control of the four channels can supply a signal SO representative of a differential current.

In another embodiment, simultaneous digital processing of the four channels by a processor can supply a signal SO representative of a differential current or of the sum of the input signals.

Figure 12:
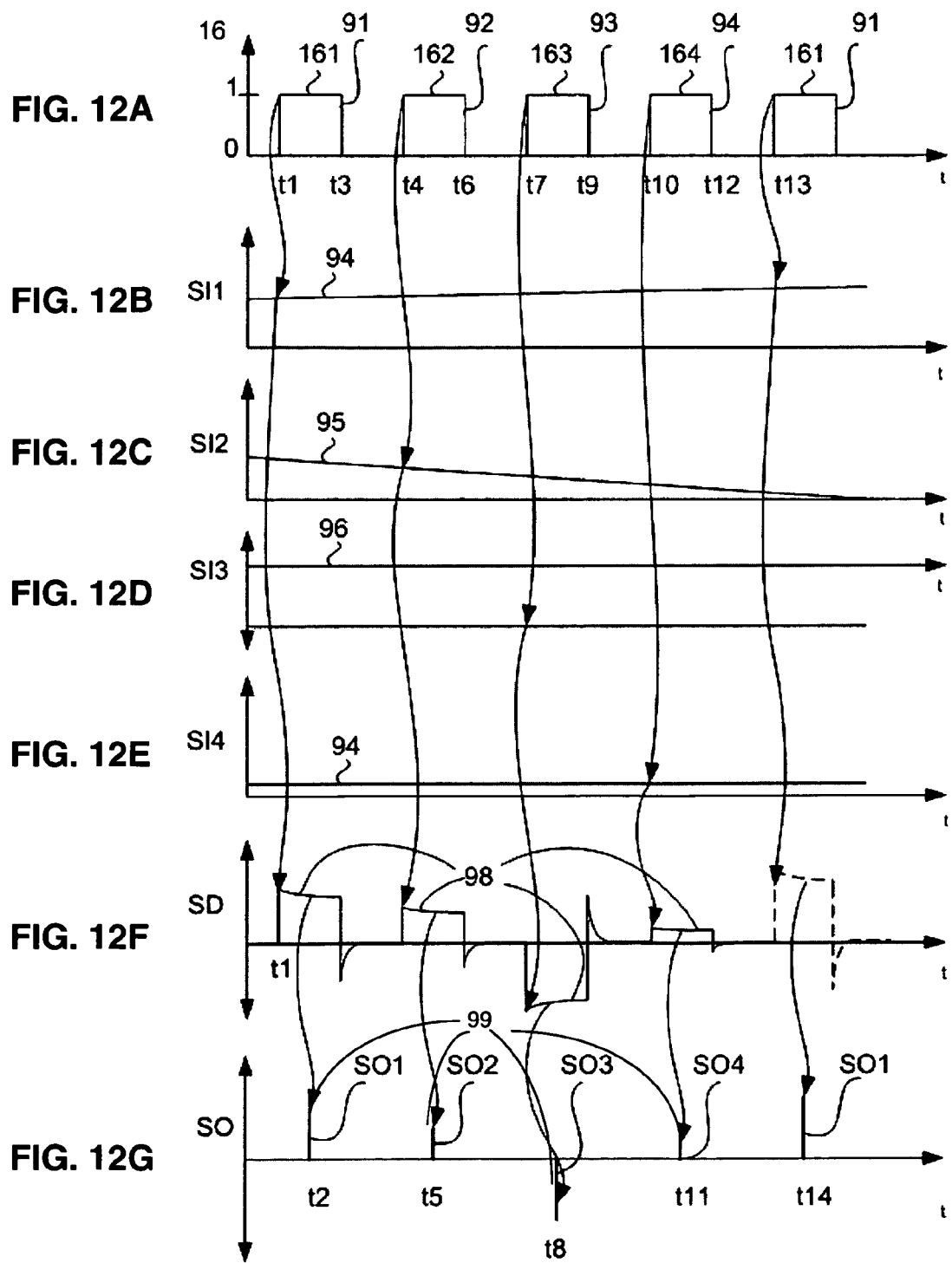
FIGS. 12A to 12G represent plots of signals in a device of FIG. 11.

FIGS. 12A to 12G represent plots of signals in a device of FIG. 11. States of the different switching means 161 to 164 are represented on plots 91 to 94 of FIG. 12A. State 1 corresponds to a closed state of the corresponding switch and state 0 corresponds to open state. FIG. 12B shows a plot 95 representative of an example of input signal SI1. FIG. 12C shows a plot 96 representative of an example of input signal SI2. FIG. 12D shows a plot 97 representative of an example of input signal SI3. FIG. 12E shows a plot 98 representative of an example of input signal SI4. FIG. 12F shows a plot 99 representative of an example of signal secondary SD. FIG. 12G shows sampling of the signal secondary to separate signal SD into four output signals SO1, SO2, SO3 and SO4 representative of the four output signals SI1, SI2, SI3, and SI4.

At a time t1, switch 161 is closed and secondary signal SD becomes representative of input signal SI1. After a time delay D enabling operation of transformer 14 to be stabilized, at a time t2, signal SD is sampled to have an output signal SO1 representative of signal SI1. At the end of control of switch 161, at a time t3, there is no longer any signal on the transformer primary, and the secondary signal goes to a zero value. At a time t4, switch 162 is closed and secondary signal SD becomes representative of input signal SI2. After a time delay D for operation of transformer 14 to be stabilized, at a time t5, signal SD is sampled to have an output signal SO2 representative of signal SI2. At a time t6, control of switch 162 is terminated. Then, at a time t7, switch 163 is closed and secondary signal SD becomes representative of input signal SI3. After a time delay D for operation of transformer 14 to be stabilized, at a time t8, signal SD is sampled to have an output signal SO3 representative of signal SI3. At a time t9, control of switch 163 is terminated. Finally, at a time t10, switch 164 is closed and secondary signal SD becomes representative of input signal SI4. After a time delay D for operation of transformer 14 to be stabilized, at a time t11, signal SD is sampled to have an output signal SO4 representative of signal SI4. At a time t12, control of switch 164 is terminated. At a time t13, the cycle restarts by closing switch 161 and sampling SD at time t14 to provide SO1. Time delay D corresponds to the wait time between start of closing of the switches and sampling of secondary signal SD on output from signal transformer 14.

Figure 13:
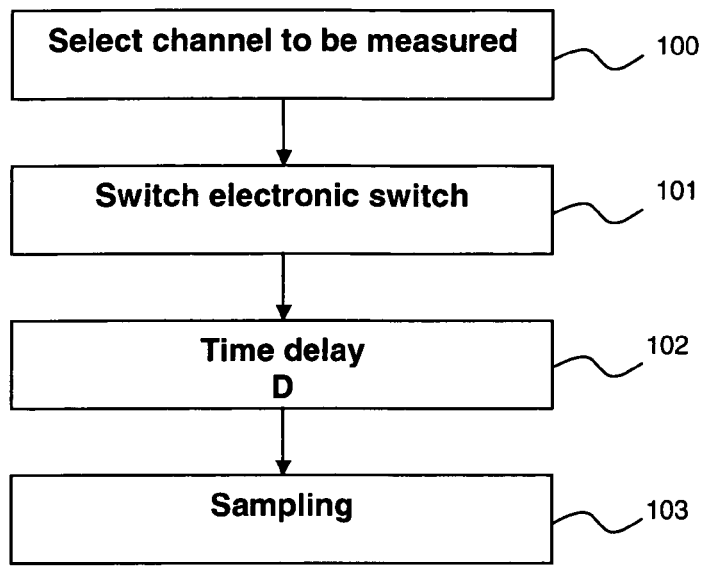
FIG. 13 represents a flowchart showing a measurement sample acquisition cycle.

FIG. 13 represents a flowchart showing a measurement sample acquisition cycle. In a step 100, the processing unit selects the channel to be measured. Then, in a step 101, an electronic switch of the switching means is closed. Then, after a time delay D for operation of the transformer to be stabilized avoiding in particular parasitic oscillations in a step 102, the processing unit commands sampling of a signal representative of secondary signal SD in a step 103. Sampling is thus performed after a preset time delay D following the start of a control impulse closing the switching means.

Figure 14:
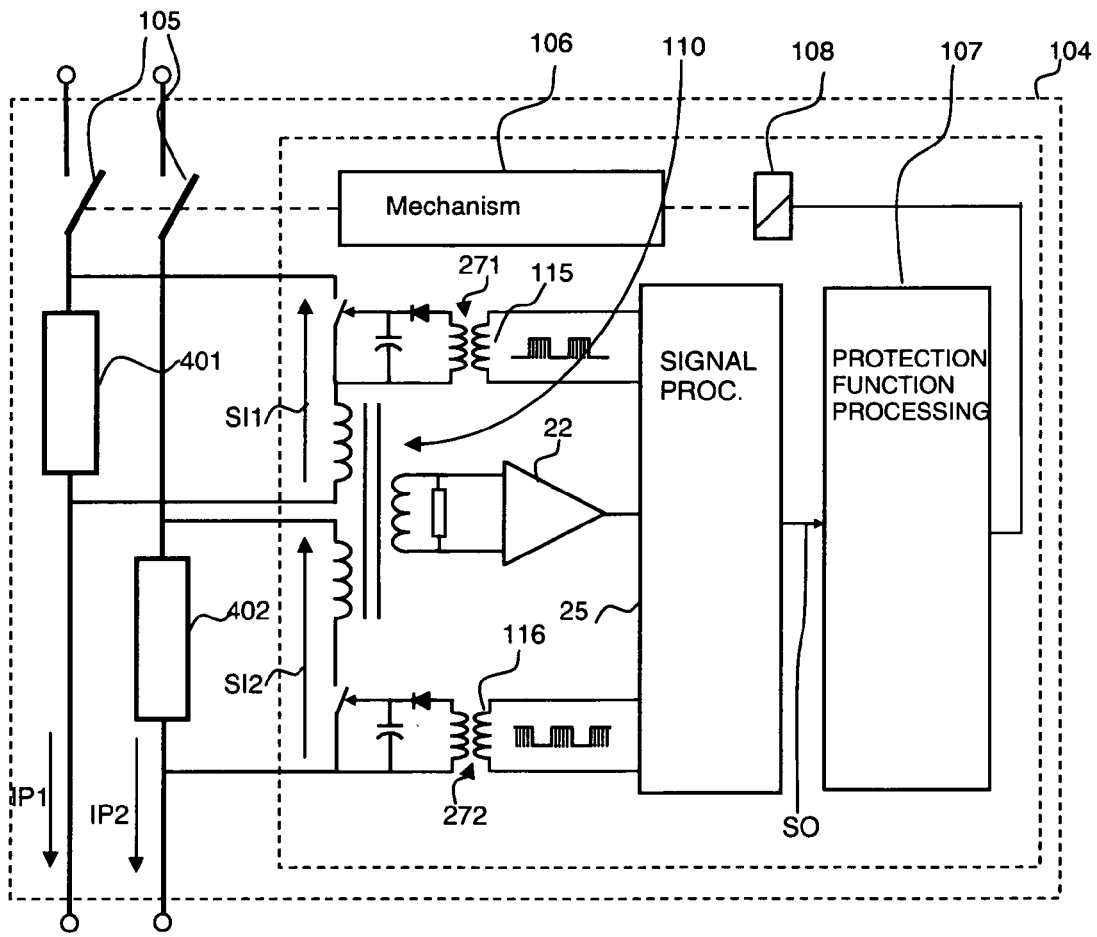
FIG. 14 represents a diagram of an electrical equipment unit comprising a measuring device according to an embodiment of the invention.

FIG. 14 represents a diagram of an electrical circuit breaker with an electronic trip unit comprising a measuring device according to an embodiment of the invention. Such an electrical circuit breaker 104 comprises at least one measuring resistor 401 and 402, electric power contacts 105 connected in series with said at least one measuring resistor, an operating mechanism 106 controlling opening of electrical contacts 105, and processing means 107 for processing protection functions commanding a relay 108 connected to said mechanism 106. According to an embodiment of the invention, the circuit breaker comprises a current measurement device 110 as described above having at least one signal input connected to said at least one measuring resistor, and a signal output connected to protection function processing means 107 to supply an output signal SO representative of a current flowing in said measuring resistor. In FIG. 14, there are two measuring resistors 401 and 402 in which two primary currents IP1 and IP2 can flow and generate input measurement signals SI1 and SI2. In this case, current measurement device 110 can be the same as that of FIG. 10 with signal multiplexing. Resistors 401 and 402 can be resistors of very low values such as electrical shunts.

In the embodiments described above, the control means of the switching means are preferably impulse transformers 27, 271, 272 having a primary winding 115 receiving the control signals and a secondary winding 116 to command switching means.

Figure 15:
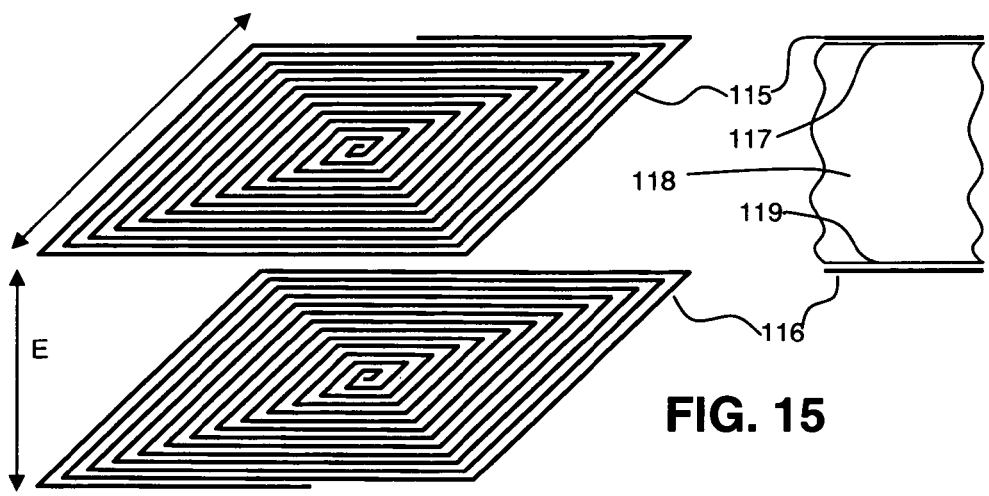
FIG. 15 represents an impulse transformer in printed form used in the control means of a current measurement device according to an embodiment of the invention.

When the control means of the switching means are impulse or high-frequency control transformers, the natural operating frequency can be very high to reduce the size of or to eliminate the magnetic circuit. Control can take the form of bursts of signals at very high frequency during a control period. FIG. 15 represents an impulse transformer in printed form used in the control means of a current measurement device according to an embodiment of the invention. In this case, the impulse transformer is an air-insulated transformer having a primary winding 115 on a first face 117 of a printed circuit 118 and a secondary winding 116 on a second face 119 of said printed circuit. The operating frequency is then very high to achieve very small winding sizes. In the embodiment of FIG. 15, each winding has thirteen turns with an outside dimension of less than one centimetre per side. Naturally in these cases the operating frequency of the control means is much higher than the switching frequency. The control signals are then square wave pulses or bursts of impulses at high frequency supplied during switching periods TC. The printed circuit can also be an etched circuit or any other circuit acting as support for example a ceramic or alumina support. Even in printed form, the control transformers can have a magnetic circuit adapted to the shapes and dimensions of the circuit support. In order to reduce the sizes of said air-insulated control transformer, a circuit support 118 is advantageously composed of a polyimide material. The circuit support preferably has a thickness E comprised between 3 and 80 μm.

In a particular embodiment case, the measuring transformer can be an air-insulated transformer having at least one primary winding 15 on a first face of a circuit support 118 and a secondary winding 21 on a second face of said circuit support. The circuit support is advantageously composed of a polyimide material with a thickness E comprised between 3 and 80 μm.

Figure 16:
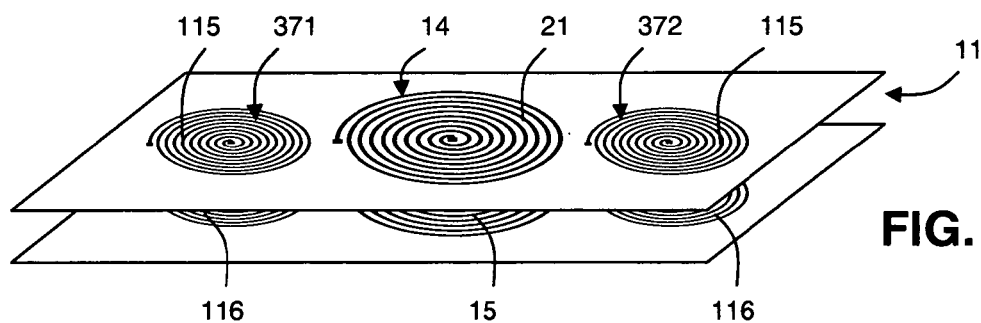
FIG. 16 represents a grouping of impulse transformers and measuring transformers in printed form used in a current measurement device according to an embodiment of the invention.

FIG. 16 shows an assembly of two control transformers and a measuring transformer placed on the same insulating support with windings on each side of said circuit support. In this case as well, the circuit support is advantageously composed of a polyimide material having a thickness E comprised between 3 and 80 μm.

Figure 17:
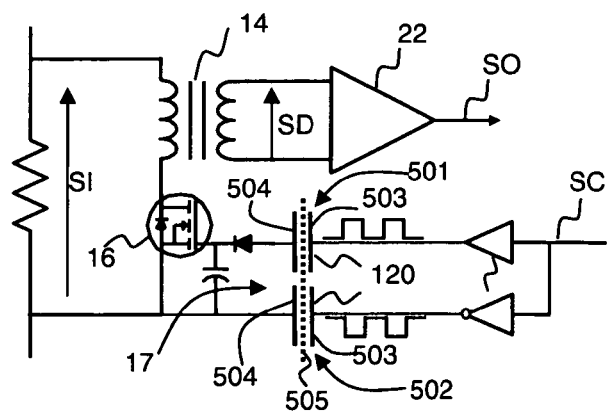
FIGS. 17 and 18 show alternative embodiments of devices according to embodiments.
Figure 18:
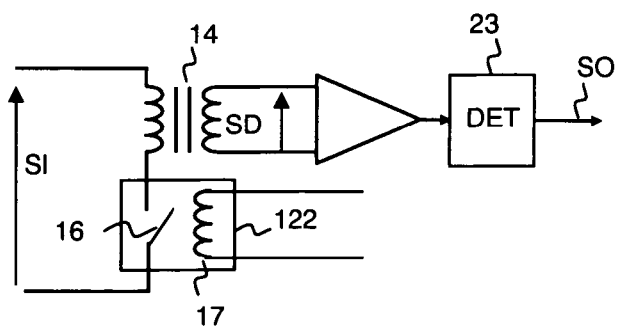

FIGS. 17 and 18 show alternative embodiments of devices according to embodiments of the invention.

In FIG. 17, the control means of the switching means are a double capacitive connection 120 letting the impulses pass and blocking the DC or low frequency current to achieve galvanic isolation. On each branch of the capacitive connection, the control signals are complementary to make a control current flow between the two connections and guarantee common mode electrical insulation. Said control means of the switching means thus comprise at least two capacitive coupling capacitors 501, 502 each having a first electrode 503 to receive the control signals and a second electrode 504 to command switching means. The capacitors are preferably achieved on a circuit support 505 composed of a polyimide material having a thickness comprised between 3 and 80 μm. In this case, said circuit support has first electrodes 503 of said two coupling capacitors 501 and 502 on a first face and second electrodes 504 of said two coupling capacitors 501 and 502 on the second face.

In FIG. 18, the control means of the switching means and the switching means are grouped in an electromagnetic microcomponent 122 preferably achieved by the technology referred to as MEMs.

Several types of switching means can be used, in particular field-effect transistors, bipolar transistors, or switches with electromagnetic, electrostatic or optic control.

The switching frequency of input signal SI may depend on the size of the coupling transformer used and on the throughput through said transformer. This switching frequency is advantageously linked to the capacities of the detection and sampling means.

The current measurement devices described above enable any type of electric signals to be measured, in particular currents, voltages, or several types in multiplexed mode on the same magnetic circuit of the signal transformer. For voltage measurement, the input signal can be provided by a voltage divider bridge.

The electrical units in which the current measurement device is implemented can be of any type. If the electrical unit comprises electrical protection functions such as those of a relay or of a circuit breaker trip unit, the measuring resistors are advantageously electrical shunts. These shunts can be of resistance or impedance type for example with inductance.

The invention claimed is:
1. A current measurement device with electrical isolation, comprising:
  at least one electrical shunt (40) for permitting a current to be measured to flow therethrough,
  at least one input port for receiving an input signal (SI), connected to said shunt for receiving a signal representative of a current, an output port for outputting an output signal (SO) representative of said input signal representative of a current, and signal transfer means with electrical isolation for receiving an input signal and supplying said output signal, said transfer means comprising:
at least one signal transformer (14) having at least one primary winding (15, 15A, 15B, 151, 152, 153, 154) for receiving a primary signal (SP, SP1, SP2, SP3, SP4) representative of an input signal (SI, SIA, SIB, SI1, SI2, SI3, SI4), switching means (16, 16A, 16B, 161, 162, 163, 164, 31, 32) for switching the input signal and providing a primary signal representative of said input signal to said primary winding, and control means (17, 17A, 17B, 27, 27A, 27B, 271, 272, 273, 274) of the switching means, comprising a control signal input (SC) for receiving control signals during switching periods (TC), and an output electrically isolated from the control signal input and connected to said switching means (16, 16A, 16B, 161, 162, 163, 164, 31, 32) for commanding primary signal switching during said switching periods (TC), characterized in that said control means of the switching means comprise electromagnetic induction and/or capacitive connection coupling means coupled to said switching means.

2. The current measurement device according to claim 1 characterized in that said signal transformer (14) comprises an output winding (21) connected to detection means (23) receiving a switched secondary output signal (SD) and supplying an output signal representative (SO) of the input signal (SI, SIA, SIB, SI1, SI2, SI3, SI4).

3. The current measurement device according to claim 2 characterized in that the detection means (23) comprise means for filtering the switched output signal.

4. The current measurement device according to claim 2 characterized in that the detection means (23) comprise synchronous detection means synchronized with control of the switching means (16, 16A, 16B, 161, 162, 163, 164, 31, 32) to reconstitute an output signal (SO) representative of said input signal (SI).

5. The current measurement device according to claim 1 characterized in that switching of the input signal (SI, SIA, SIB, SI1, SI2, SI3, SI4) is unidirectional.

6. The current measurement device according to claim 1 characterized in that switching of the input signal (SI, SIA, SIB, SI1, SI2, SI3, SI4) is bidirectional or with reversal.

7. The current measurement device according to claim 1 characterized in that the signal transformer (14) comprises two primary windings (15A, 15B) connected with reverse winding direction, a first end of each winding is connected to a common point of the windings to receive the signal input, and second ends of the windings are connected to first switching means (16A) and to second switching means (16B) to switch and direct the input signal (SI, SIA, SIB) alternately onto the first and second winding.

8. The current measurement device according to claim 7 characterized in that the switching means switch input signals on the primary windings (15A, 15B) with a command overlap at the start and end of switching.

9. The current measurement device according to claim 1 characterized in that the signal transformer (14) comprises a primary winding (15) connected to switching means (16) comprising four electronic switches (16A1, 16A2, 16B1, 16B2) connected in the form of a bridge with two branches (50, 51), external lines of the bridge receiving the input signal (SI) and internal branches (53) of the bridge being connected to said primary winding (15) of said signal transformer, said switches in the form of a bridge being commanded alternately in crossover manner to reverse the direction of the primary signal (SP) applied to the primary winding (15) of said signal transformer (14).

10. The current measurement device according to claim 1 characterized in that the input signal (SI, SIA, SIB) is applied to a shunt formed by a bridge of two measuring resistors (40A, 40B) connected in series, a common point (54) of the measuring resistors being connected to a first end of a primary winding (15) of the signal transformer (14), a second end of said primary winding (15) of the signal transformer being connected to a common central part (55) of a switching bridge with two switches (16A, 16B) of the switching means, external lines (57, 58) of the switches of said bridge being connected to the external parts (59, 60) opposite the common point of the resistor bridge, the two switches operating alternately to reverse the direction of the primary signal (SP) applied to the primary winding (15) of said signal transformer (14).

11. The current measurement device according to claim 1 characterized in that the signal transformer (14) comprises:
at least a first primary winding (151) to receive a first input signal (SI1) representative of a current flowing in a first shunt (40C) and at least first switching means (161) to switch said first input signal,
at least a second primary winding (152) to receive a second input signal (SI2) representative of a current flowing in a second shunt (40D) and at least second switching means (162) to switch said second input signal, said electrical shunt being electrically separated from said first shunt, and
at least one secondary winding (21) to supply a signal (SD) representative of said first input signal (SI1) or of said second input signal (SI2).

12. The current measurement device according to claim 11 further comprising processing means (25):
to select first control means (271) of said first switching means (161) to supply an output signal (SO) representative of said first input signal (SI1), or
to select second control means (272) of said second switching means (162) to supply an signal output (SO) representative of said second input signal (SI2).

13. The current measurement device according to claim 12 characterized in that the processing means (25) command selection of the control means sequentially to supply a multiplexed output signal (SO) sequentially representative of each input signal (SI1, SI2, SI3, SI4).

14. The current measurement device according to claim 12 characterized in that the processing means (25) command control means simultaneously to supply an output signal (SO) representative of the sum of the input signals.

15. The current measurement device according to claim 12 characterized in that the processing means (25) comprise signal sampling means (88) to sample an output signal representative of a multiplexed secondary signal (SD) and to supply values representatives of each input signal, sampling being synchronized with selection of the control means.

16. The current measurement device according to claim 15 characterized in that sampling is performed after a preset time delay (D) following the start of a control impulse closing switching means (16, 16A, 16B, 161, 162, 163, 164, 31, 32).

17. The current measurement device according to claim 12 characterized in that the processing means (25) activate command of the control means during periods of short duration and stop command of the control means during periods of long duration.

18. The current measurement device according to claim 1 characterized in that said control means of the switching means comprise at least one control transformer (27, 271, 272, 273, 274, 27A, 27B) having a primary winding receiving the control signals and a secondary winding to control switching means.

19. The current measurement device according to claim 18 characterized in that the at least one control transformer of the control means is an air-insulated transformer having a primary winding (115) on a first face (117) of a circuit support (118) and a secondary winding (116) on a second face (119) of said circuit support.

20. The current measurement device according to claim 19 characterized in that the circuit support is composed of a polyimide material.

21. The current measurement device according to claim 19 characterized in that the circuit support has a thickness (E) comprised between 3 and 80 µm.

22. The current measurement device according to claim 18 characterized in that said at least one control transformer (371, 372) and at least one measuring transformer (14) are placed on the same insulating support (118) with windings (116, 116, 15, 21) on each side of said circuit support.

23. The current measurement device according to claim 22 characterized in that the circuit support is composed of a polyimide material and has a thickness (E) comprised between 3 and 80 µm.

24. The current measurement device according to claim 1 additionally comprising a measuring transformer which is an air-insulated transformer having at least one primary winding (15) located on a first face (117) of a circuit support (118) and a secondary winding (21) on a second face (119) of said circuit support.

25. The current measurement device according to claim 24 characterized in that the circuit support is composed of a polyimide material and has a thickness (E) comprised between 3 and 80 µm.

26. The current measurement device according to claim 1 characterized in that said control means of the switching means comprise at least two capacitive coupling capacitors (501, 502) each having a first electrode (503) to receive the control signals and a second electrode (504) to command switching means.

27. The current measurement device according to claim 26 further comprising a circuit support (505) composed of a polyimide material having a thickness comprised between 3 and 80 µm, said circuit support having the first electrodes (503) of said two coupling capacitors (501, 502) on a first face and the second electrodes (504) of said two coupling capacitors on the second face.

28. The current measurement device according to claim 1 characterized in that it also comprises control means of the switching means (17) and that the switching means (16) are grouped in an electromagnetic microcomponent (122) of MEMS type.

29. An electronic trip unit, comprising:
a current measurement device,
a processing unit (107) for processing protection functions, connected to the current measurement device to receive at least one signal (ID) representative of a current,
trip output means for supplying a trip signal according to said at least one current signal, wherein said current measurement device is a current measurement device according to claim 1 so that the current signal supplied to the processing unit is processed by the protection functions to supply a trip signal.

30. An electrical circuit breaker comprising:
electric power contacts (105),
an operating mechanism (106) for commanding opening of said electric contacts,
a current measurement device according to claim 1 connected in series with said electric contacts,
a processing unit (107) for processing protection functions connected to the current measurement device and for receiving at least one signal (ID) representative of a current,
trip output means for supplying a trip signal for opening of the electric contacts according to said at least one current signal,
wherein the current signal supplied to the processing unit is processed by the protection functions to supply said trip signal for opening the electric contacts.

* * * * *